United States Patent [19]
Sotom et al.

[11] Patent Number: 5,367,396
[45] Date of Patent: Nov. 22, 1994

[54] OPTICAL FREQUENCY MARKING METHOD AND DIFFERENT FREQUENCY CHANNEL COMMUNICATION NETWORK USING IT

[75] Inventors: Michel Sotom, Villebon sur Yvette; Olivier Audouin, Savigny sur Orge; Jean-Michel Gabriagues, Le Val Saint-Germain, all of France

[73] Assignee: Alcatel N.V., Amsterdam, Netherlands

[21] Appl. No.: 947,463

[22] Filed: Sep. 21, 1992

[30] Foreign Application Priority Data

Sep. 26, 1991 [FR] France .................................. 91 11856

[51] Int. Cl.$^5$ .................................................. H04B 17/00
[52] U.S. Cl. ................................ 359/124; 359/110; 359/182; 356/349
[58] Field of Search ............... 359/124, 125, 132, 110, 359/155, 187, 178, 181, 182; 332/118, 126; 334/13, 18, 30; 324/76.16, 76.19, 76.22, 76.41, 76.36; 356/401, 349

[56] References Cited

U.S. PATENT DOCUMENTS 4,856,899  8/1989  Iwaoka et al. ...................... 356/346

FOREIGN PATENT DOCUMENTS 0249112  12/1987  European Pat. Off. .
0293008  11/1988  European Pat. Off. .
0368566  5/1990  European Pat. Off. .

OTHER PUBLICATIONS

Glance et al, "Densely Spaced FDM Coherent Star Network With Optical Signals Confined to Equally Spaced Frequencies", *J of Lightwave Technology* v 6 n 11 (Nov. 1988), pp. 1770–1781.

Maeda, "Frequency Stabilization Techniques for Coherent Lightwave Systems", *SPIE* v 1175 *Coherent Lightwave Communications* (1989), pp. 4–11.

Kasovsky et al, "Experimental Relative Frequency Stabilization of a Set of Lasers Using Optical Phase-Locked Loops", *IEEE Photonics Technology Letters* v 2 n 7 (Jul. 1990), pp. 516–518.

Shimosaka et al, "THG3 Frequency Locking of FDM Optical Sources using Widely Tunable DBR LDs", *OFC 1988/Thursday Morning*, p. 168.

Bachus et al, "Coherent Optical–fibre Subscriber Line", *Electronics Letters*, v 21 n 25/26 (Dec. 1985)), pp. 1203–1205.

*Primary Examiner*—Richard E. Chilcot, Jr.
*Assistant Examiner*—Richard A. Moller
*Attorney, Agent, or Firm*—Robbins, Berliner & Carson

[57] ABSTRACT

In an optical frequency marking method and a frequency channel communication network using this method, an optical reference frequency is scanned across a scanning band to produce frequency coincidences with a monitored frequency which constitutes the frequency to be marked. During each scanning half-cycle it effects a go path and a return path according to a known law to produce a go frequency coincidence and a return frequency coincidence. A marker interval is measured which is the time elapsed between said two coincidences. This interval marks the monitored frequency and enables said frequency to be locked by comparison with a set point interval. The invention finds a particular application in the marking and stabilization of carrier frequencies of a closely-spaced different frequency channel network.

6 Claims, 3 Drawing Sheets

OPTICAL FREQUENCY MARKING METHOD AND DIFFERENT FREQUENCY CHANNEL COMMUNICATION NETWORK USING IT

BACKGROUND OF THE INVENTION

FIELD OF THE INVENTION

The present invention concerns a method of marking optical frequencies. This method finds a particular application in a communication network using optical fibers to guide carriers produced by semiconductor laser sources. The carriers are modulated with data to be transmitted and occupy a succession of different frequency channels constituting transmission channels. Some known networks of this kind, known as dispersed source networks, comprise the following components:

A succession of terminals each comprising optical send and receive means for sending and receiving data conveyed by a succession of modulated waves occupying a succession of different frequency channels in a predetermined communication band and resulting from the modulation of a succession of carrier waves of said channels, respectively.

A reference block sending an optical reference wave at a reference frequency.

Optical fibers linking said terminals to each other and to said reference block to transmit said modulated waves and said reference waves.

The send means of each terminal comprise:
 a monitored source comprising a semiconductor laser emitting a monitored wave to constitute the carrier wave of one channel, said wave having a monitored frequency constituting a carrier frequency of said channel,
 frequency control means for controlling said monitored frequency,
 modulation means for modulating said monitored wave and constituting a modulated wave, and
 frequency comparator means comparing said reference and monitored frequencies and operating on said frequency control means to lock said monitored frequency relative to said reference frequency.

Other networks of this kind are called grouped source networks and comprise a plurality of sources in the same terminal.

The availability of indium phosphide semiconductor laser sources which are strongly coherent and whose wavelength can be tuned has made it possible to adopt dense spaced multiplexing techniques in implementing these various networks. These techniques are directed to enabling these networks to operate with as small as possible a spacing between adjacent channels, to obtain the maximum benefit from the transmission window of the fibers around the frequency defined by the wavelength 1 550 nm.

The resulting drawback, which constitutes a major obstacle to the development of this type of technique, resides in the need to stabilize the frequency at which these sources emit and to define them with great accuracy. The problem is prevent unwanted progressive drift of the carrier frequency of one channel creating problems of crosstalk with an adjacent channel such as to compromise transmission. Also, the carrier frequency provides the means of identifying the channel and must therefore be defined absolutely. This is why this frequency must be monitored, that is to say measured or at least marked, the source and the carrier wave being therefore also monitored.

The problem is particularly difficult in the case of dispersed source networks because the sources cannot be grouped together at the same geographical site; this is the case with an interactive communication network in particular.

Various solutions have been proposed for this problem: the reference frequency may be a single frequency. It may then be distributed through the same fibers as the modulated waves if this frequency is in the margin of the communication band occupied by the transmission channels. The monitored sending source within a terminal is then stabilized relative to this reference frequency using a fixed or scanning Fabry-Perot interferometer. On this point reference may usefully be had to the article:

Journal of lightwave technology, vol. 6 No 0 11 November 1988, pages 1770-1781, DENSELY SPACED FDM COHERENT STAR NETWORK WITH OPTICAL SIGNALS CONFINED TO EQUALLY SPACED FREQUENCIES—B.S. GLANCE, J. STONE, K. J. POLLOCK, P. J. FITZGERALD, C. A. BURRUS, JR., B. L. KASPER, and L. W. STULZ.

In one alternative solution a plurality of reference frequencies can constitute what is known as a "comb". The distribution of a comb of optical frequencies is supported by an ancillary fiber network so as not to disturb the use of the transmission channels. The frequency comb may be produced within the reference block by angular modulation of a coherent reference source. In this case the optical spectrum has a series of equi-distant lateral lines whose spacing is equal to the modulation frequency. Each monitored source can then be locked in frequency or in phase to one of the lateral lines of the reference source after heterodyne or homodyne detection. Reference may usefully be had on this topic to the article:

FREQUENCY STABILIZATION TECHNIQUES FOR COHERENT LIGHTWAVE SYSTEMS—M. W. MAEDA, SPIE vol. 1175 Coherent Lightwave Communications (1989)—p. 4–11. and the article: EXPERIMENTAL RELATIVE FREQUENCY STABILIZATION OF A SET OF LASERS USING OPTICAL PHASE-LOCKED LOOPS—LEONID G. KASOVSKY and BENITE JENSEN—IEEE PHOTONICS TECHNOLOGY LETTERS. VOL. 2 No 7 JULY 1990 p. 516-518.

In the simpler case where the sources are grouped together in the same terminal, which is the case with a distribution network, other techniques have been proposed. One is the "heterodyne spectroscopy" technique described in the article: COHERENT OPTICAL-FIBER SUBSCRIBER LINE—E. J. BACCHUS—R. P. BRAUN—W. EUTIN—E. GROBMANN—H. FOISEL—K. HEIMES—B. STREBEL.—ELECTRONICS LETTERS Dec. 5, 1985 Vol. 21 No 25/26—P. 1203-1205. Another is the so-called "reference impulse" method described in the article: SHIMOSAKA—THG3 Frequency Locking of FDM optical sources using widely tunable DBR LDs—N. SHIMOSAKA—K. KAEDE, S. MURATA—OFC.88/THURSDAY MORNING/168. A common feature of these methods is the use of a so-called "master laser" reference source the optical frequency of which is periodically scanned across the band occupied by the network. The reference wave that it emits is mixed with all the channels and by heterodyne detection this produces a succession of electrical impulses at coincident frequencies.

In the so-called "heterodyne spectroscopy" technique the current value of the master laser control electrical signal at the time of the pulse is compared with its nominal value—value representing the frequency reserved to this channel. Any difference with respect to this nominal value is directly related to the frequency offset and can be used to correct the sending frequency of the monitored source.

The so-called "reference pulse" technique uses a stream of reference pulses produced by detecting the lightwave emitted by the master laser and transmitted by a calibration Fabry-Perot cavity whose free band gap is precisely equal to the frequency spacing to be maintained between the carrier frequencies of adjacent channels. Any time offset between a reference pulse and a respective coincidence pulse indicates drift of the respective monitored frequency and constitutes an error signal that can be used to lock that frequency.

A particular object of the present invention is to enable simple implementation of a communication network with different frequency channels operating securely despite close spacing between adjacent channels. A more general object of the present invention is to define an optical frequency marking method which is both simple and accurate so that using it in a communication network with different frequency channels makes it possible to achieve the previously indicated particular object of the invention, even if the sources to be monitored are divided between geographical locations.

SUMMARY OF THE INVENTION

In one aspect, the present invention consists in an optical frequency marker method whereby an optical reference frequency scans a scanning band to cause coincidence between two frequencies one related to said reference frequency and the other related to a monitored frequency to be marked, said frequency coincidences being used to mark said monitored frequency relative to values assumed by said reference frequency, in which method the reference frequency is scanned through a half-cycle comprising a go path and a return path effected according to a known law to produce a go frequency coincidence and a return frequency coincidence during said go path and said return path, respectively, and a marker interval is measured consisting of the time interval which elapses between said two coincidences, this interval constituting a marker of said monitored frequency.

The frequencies whose coincidences are used may be the reference and monitored frequencies themselves. Alternatively, frequency coincidence may be the condition achieved by the difference between the reference and monitored frequencies passing through a predetermined value, for example the frequency specific to an electric filter.

In a second aspect, the present invention consists in a different frequency channel communication network comprising:

a succession of terminals each comprising optical send means and optical receive means for sending and receiving data conveyed by a succession of modulated waves occupying a succession of different frequency channels and resulting from the modulation of a succession of carrier frequencies of said channels, respectively, the set of said channels occupying a predetermined communication band, a reference unit sending a reference wave having a reference frequency, and optical fibers linking said terminals to each other and to said reference unit to transmit said modulated waves and said reference wave, the send means of each of said terminals comprising:

a monitored source consisting of a semiconductor laser emitting a monitored wave to constitute the carrier wave of a channel, said wave having a monitored frequency constituting a carrier frequency of said channel, frequency control means for controlling said monitored frequency, modulator means for modulating said monitored wave and constituting a modulated wave, and frequency comparator means comparing said reference and monitored frequencies and operating on said frequency control means to lock said monitored frequency relative to said reference frequency, in which network said reference frequency effects at least one scanning half-cycle according to a known law as a function of time and during which said frequency progressively moves from a first end to a second end of a scanning band on a go path and then returns from said second to said first end on a return path, said scanning band being chosen so that said scanning half-cycle produces a go frequency coincidence during said go path and then a return frequency coincidence during said return path, said frequency comparator means of each terminal measuring a marker interval consisting of the time interval between the go and return frequency coincidences of the same scanning half-cycle, said frequency comparator means producing an error signal representing a difference between the marker interval and a set point interval, said error signal being supplied to said frequency control means to lock said monitored frequency to a set point frequency defined by said set point interval.

How the present invention may be put into effect will now be described in more detail by way of non-limiting example with reference to the appended diagrammatic drawings. If the same component is shown in more than one figure it is always denoted by the same reference symbol. It must be understood that the components mentioned may be replaced by other components implementing the same technical function.

DETAILED DESCRIPTION OF THE INVENTION

Figure 1:
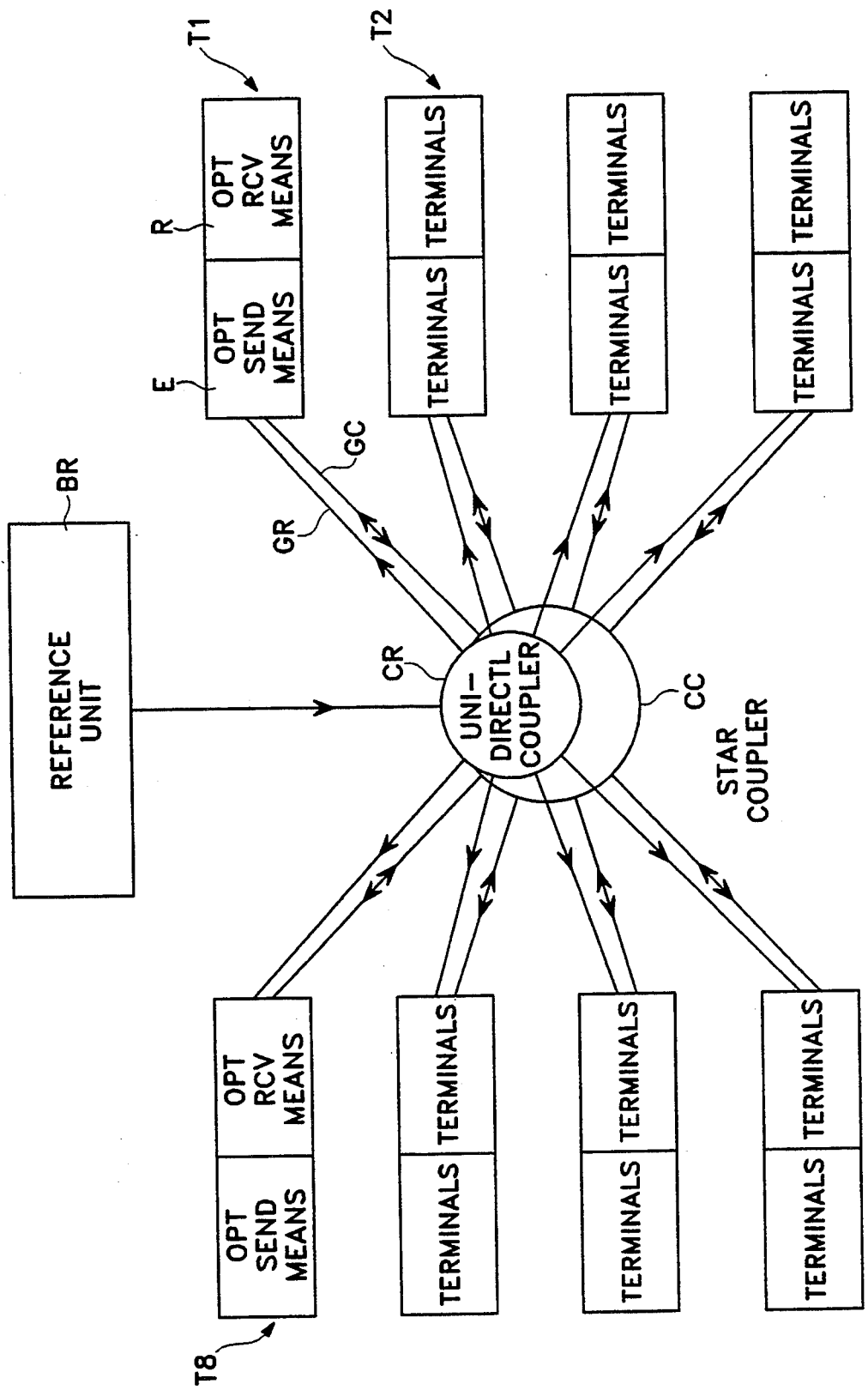
FIG. 1 is an overview of a network in accordance with the present invention.
Figure 2:
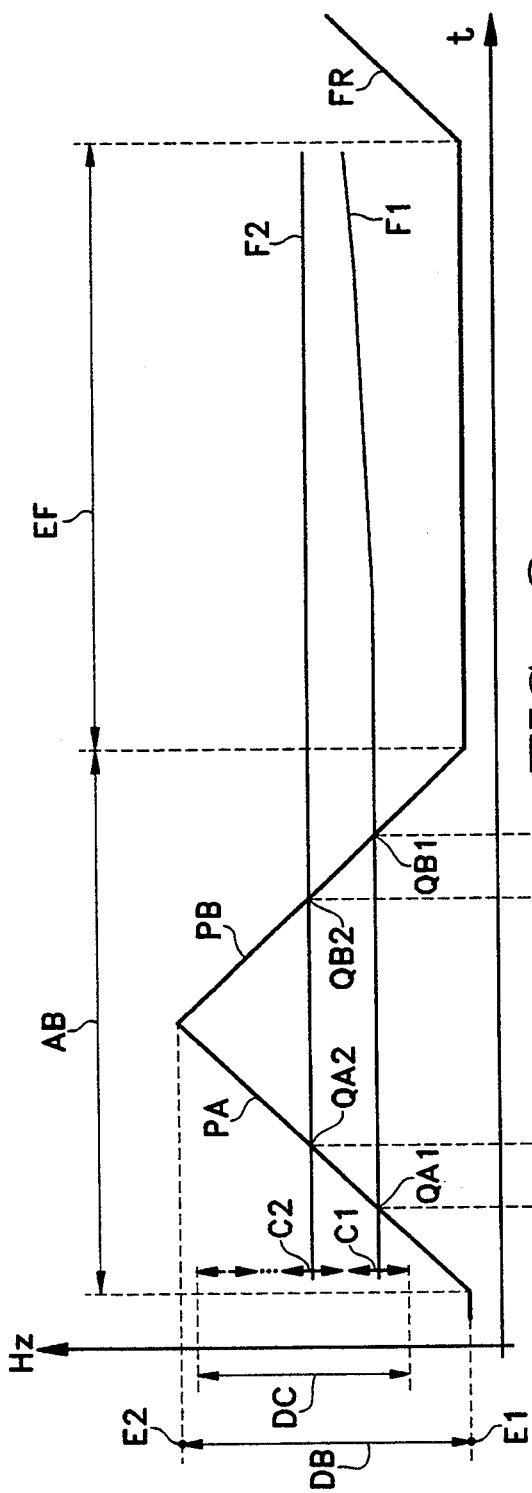
FIG. 2 is a diagram showing the variation of a reference frequency and two monitored frequencies transmitted by two terminals of this network, the frequency being plotted on the vertical axis and time on the horizontal axis.
Figure 3:
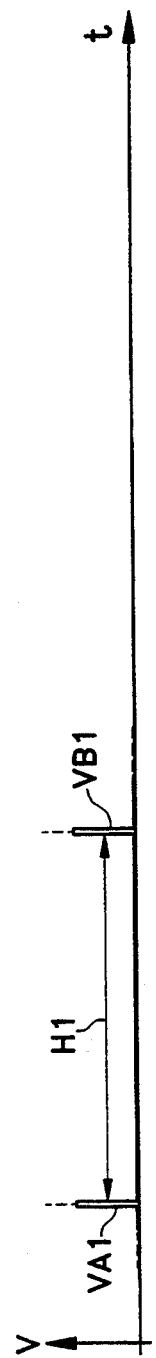
FIGS. 3 and 4 are two diagrams showing the variation of the output signals of two opto-electronic detectors supplying coincidence pulses in the respective terminals, an electrical amplitude being plotted on the vertical axis and time on the horizontal axis.

Referring to FIGS. 1 and 2, an optical communication network comprises the following components whose functions are known from the MAEDA article:

A succession of terminals T1 through T8. Each terminal, for example terminal T1, comprises optical send means E and optical receive means R for sending and receiving data. In the network as a whole data is carried by a succession of modulated waves occupying a succession of different frequency channels C1, C2. These waves are obtained by modulating carrier waves of these channels. The set of the latter occupies a predetermined communication band DC.

A reference unit BR sending a reference wave at a reference frequency FR.

Communication optical fibers GC etc which handle the exchange of messages between the various terminals through the intermediary of a star coupler CC.

Finally, reference optical fibers GR which transmit the reference wave from the reference unit BR to all of the terminals through a unidirectional coupler CR.

Figure 5:
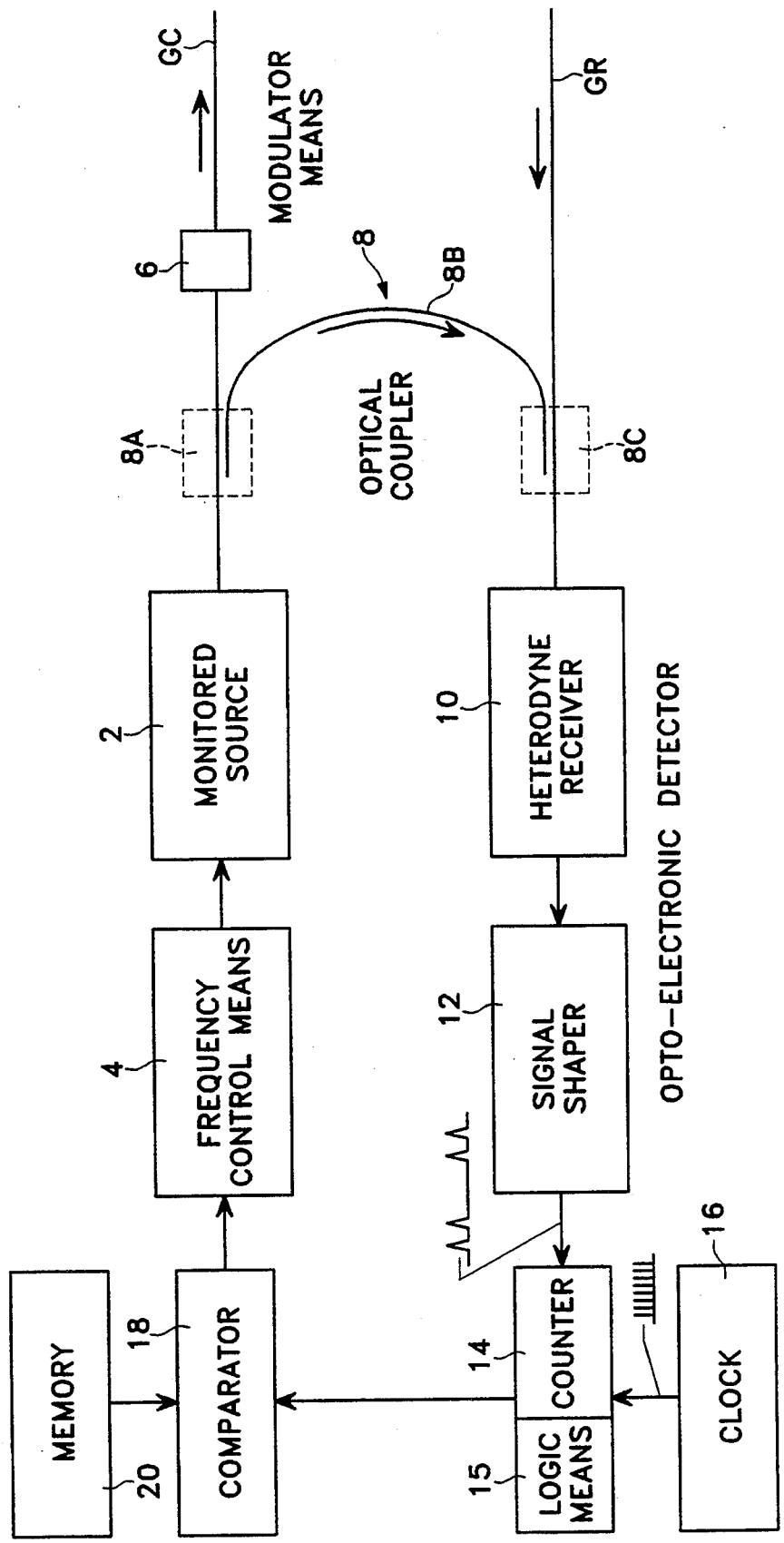
FIG. 5 is an overview of the sending means of one of the two terminals.

Referring to FIG. 5, the send means of each of the terminals T1 etc comprise:

- a monitored source 2 comprising a semiconductor laser emitting a monitored wave to constitute the carrier wave of one channel, said wave having a monitored frequency F1 constituting a carrier frequency of said channel,
- frequency control means 4 for controlling said monitored frequency,
- modulator means 6 for modulating said monitored frequency to constitute a said modulated wave, and
- frequency comparator means for comparing said reference and monitored frequencies and operating on said frequency control means to lock said monitored frequency to said reference frequency.

The frequency comparator means use an optical frequency marking method in accordance with the present invention and will be described at the same time as this method.

This method comprises the following operations known from the BACCHUS article in the case where the sources to be monitored are grouped together in the same terminal and can therefore be controlled without difficulty over electrical connections:

Frequency scanning effected by the reference frequency FR. This scanning constitutes marker scanning causing this frequency to assume a succession of values. The scanning rate is greater than the rate of any variation of the monitored frequency F1.

Detection of coincidence between the frequencies FR and F1 or (this alternative is not shown) between two other frequencies respectively related to the monitored frequency and the reference frequency.

Finally, use of frequency coincidence to mark the monitored frequency relative to the succession of values assumed by the reference frequency.

According to the present invention the marker scanning effected by the reference frequency comprises at least one scanning half-cycle AB carried out with precise timing and according to a known law. During this half-cycle the reference frequency FR moves progressively from a first end E1 to a second end E2 of a scanning band DB along a "go" path PA. It then returns from this second end to this first end along a "return" path PB. This scanning band is chosen so that this scanning half-cycle causes a go frequency coincidence QA1 during the go path and then a return frequency coincidence QB1 during the return path.

The operation which uses these frequency coincidences involves measuring a marker time H1 consisting of the time interval between the go and return frequency coincidences of the same scanning half-cycle.

The frequency coincidence detection operation comprises the following operations:

Mixing of the reference and monitored waves to form a mixed wave. Referring to FIG. 5, this mixing is done by means of an optical coupler 8 which samples from the communication fiber GC a small fraction of the monitored wave produced by the source 2 and which mixes it with the reference wave reaching the terminal T1 via the reference fiber GR.

Detection of said mixed wave by an opto-electronic detector comprising heterodyne receiver 10 and signal shaper 12 to form an electrical coincidence pulse when a component of said mixed wave passes through a predetermined detection frequency. This latter frequency is preferably less than 1 GHz so that it can be easily processed by an electronic circuit within the terminal. Two go and return coincidence pulses VA1 and VB1 represent two respective go and return frequency coincidences. The detector includes the heterodyne receiver 10. For optimum detection in this receiver the reference wave has two orthogonal linear polarizations which alternate at a sufficiently fast rate to enable the use of the signal provided by this receiver irrespective of the polarization of the monitored wave. This receiver is followed by the electronic signal shaper circuit 12 to produce the coincidence pulses.

These pulses are received by a timing device comprising a counter 14 which counts clock pulses supplied by a clock 16. This counter is triggered by each go coincidence pulse and stopped by each return coincidence pulse and then reset to zero after supplying the count result, that is to say the marker interval H1, to a comparator 18. It includes logic means 15 for distinguishing between the go and return coincidence pulses. To this end the marker scanning is preferably in the form of a periodic series of scanning half-cycles AB each having a half-cycle AB duration and separated from each other by separation intervals EF greater than this half-cycle duration.

The coupler 8, the detector 10, 12, the timing device 14, 16 and the comparator 18 constitute the frequency comparator means previously mentioned. They supply an error signal representing a difference between the marker interval H1 and a set point interval. This error signal is supplied to the frequency control means 4 to lock said monitored frequency to a set point frequency defined by said set point interval.

The set point interval is, for example, represented by one of the numbers stored in a memory 20, the comparator 18 comparing the number of clock pulses counted by the counter 14 and the stored number.

Of course, the stored numbers read by the various comparators 18 etc of the various terminals differ from each other to define the succession of carrier frequencies of the network.

It must also be understood that, without departing from the scope of the present invention, the set point interval could be a variable interval defined by a network management unit rather than a predetermined interval defined by a memory 20.

As shown in FIG. 2, the known reference frequency variation law is preferably a linear law and advantageously a law with two opposite slopes for the go and return paths.

Figure 4:
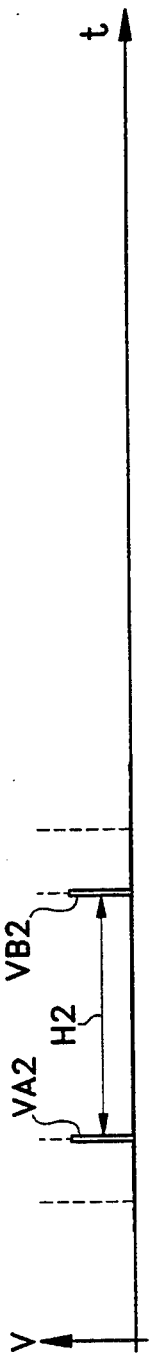

FIG. 4 shows the coincidence pulses VA2 and VB2 formed in the terminal T2 and representing coincidences QA2 and QB2 between the carrier frequency F2 of this terminal and the reference frequency FR.

The various components may be of known types. In the network shown the coupler is a hybrid coupler. It comprises a coupler element 8A to sample a fraction of the monitored wave, a guide 8B to guide this fraction to the reference fiber GR and a second coupler element 8C to mix this fraction with the reference wave.

There is claimed:

1. Optical frequency marker method comprising the steps:

scanning an optical reference frequency across a half-cycle comprising a predetermined first path in a first direction and a predetermined second path in a second direction, each said path consisting of a predetermined time-varying sequence of frequencies, to produce during the scanning of said first path a first frequency coincidence between two frequencies one related to said reference frequency and the other related to a monitored frequency to be marked, and to produce during the scanning of said second path a second frequency coincidence between the same said two frequencies, and measuring a marker interval consisting of the time interval which elapses between said first frequency coincidence and said second frequency coincidence.

2. Method for marking at least one monitored frequency of a monitored wave emitted in a predetermined optical communication band by a monitored source, the method comprising the following steps:

causing a reference frequency of a reference optical wave emitted by a reference source to assume a succession of scanned values during at least one scanning half-cycle in which the reference frequency is scanned in accordance with a predetermined function of time progressively from a first end to a second end of a predetermined scanning band on a first path and then progressively returns from said second end to said first end on a second path, at a predetermined scanning rate greater than the rate of any variation of the monitored frequency, such that said scanning half-cycle produces a first frequency coincidence during said first path and then a second frequency coincidence during said second path, detecting coincidence between two frequencies respectively related to said monitored frequency and to said reference frequency, and measuring a marker interval consisting of the time interval between the first and second frequency coincidences of a same scanning half-cycle to thereby mark said monitored frequency relative to said succession of values assumed by the reference frequency.

3. Method according to claim 2 wherein said step of detecting coincidence further comprises:

mixing said reference and monitored waves to form a mixed wave, and using an opto-electronic detector to form an electrical coincidence pulse when a component of said mixed wave passes through a predetermined detection frequency less than 1 Ghz, two successive coincidence pulses representing the first and second frequency coincidences, respectively.

4. Method according to claim 3 wherein a plurality of monitored frequencies constitute sending frequencies of a succession of said monitored sources of a succession of terminals dispersed at a distance from each other, respectively, each of said terminals receives said reference wave from a common reference unit sending said wave, and each of said terminals comprises:
said monitored source,
an optical coupler for carrying out said mixing operation,
an opto-electronic detector for supplying said first and second coincidence pulses, and
a timing device receiving said two coincidence pulses to measure said marker interval.

5. Method according to claim 2 wherein said at least one scanning half-cycle comprises a periodic series of scanning half-cycles each having a half-cycle duration and separated from each other by separation intervals greater than said half-cycle duration.

6. Different frequency channel communication network comprising:

a succession of terminals each comprising optical send means and optical receive means for sending and receiving data conveyed by a succession of modulated waves occupying a succession of different frequency channels and resulting from the modulation of a succession of carrier frequencies of said channels, respectively, the set of said frequency channels occupying a predetermined communication band, a reference unit sending a reference wave having a reference frequency, said reference frequency effecting at least one scanning half-cycle according to a predetermined function of time and during which said frequency progressively moves from a first end to a second end of a scanning band on a first path and then progressively returns from said second end to said first end on a second path, said scanning band being such that said scanning half-cycle produces a first frequency coincidence during said first path and then a second frequency coincidence during said second path, and optical fibers linking said terminals to each other and to said reference unit to transmit said modulated waves and said reference wave, wherein the send means of each of said terminals further comprises a monitored source consisting of a semiconductor laser emitting a monitored wave to constitute the carrier wave of a channel, said wave having a monitored frequency constituting a carrier frequency of said channel, frequency control means for controlling said monitored frequency, modulator means for modulating said monitored wave to thereby produce a respective one of said modulated waves, and frequency comparator means for measuring a marker interval consisting of the time interval between the first and second frequency coincidences of a same scanning half-cycle, and producing an error signal representing a difference between the measured marker interval and a predetermined set point interval, said error signal being supplied to said frequency control means to thereby lock said monitored frequency to a set point frequency defined by said predetermined set point interval.

* * * * *